(12) United States Patent
Hwang et al.

(10) Patent No.: US 8,816,396 B2
(45) Date of Patent: Aug. 26, 2014

(54) E-MODE HIGH ELECTRON MOBILITY TRANSISTOR AND METHOD OF MANUFACTURING THE SAME

(75) Inventors: In-jun Hwang, Hwaseong-si (KR); Jong-seob Kim, Hwaseong-si (KR); Hyuk-soon Choi, Hwaseong-si (KR); Ki-ha Hong, Cheonan-si (KR); Jai-kwang Shin, Anyang-si (KR); Jae-joon Oh, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 95 days.

(21) Appl. No.: 13/222,322

(22) Filed: Aug. 31, 2011

(65) Prior Publication Data

US 2012/0086049 A1    Apr. 12, 2012

(30) Foreign Application Priority Data

Oct. 11, 2010   (KR) .................. 10-2010-0098995

(51) Int. Cl.
*H01L 29/778*   (2006.01)

(52) U.S. Cl.
USPC ............. 257/194; 257/E29.246; 257/E21.403

(58) Field of Classification Search
USPC .......................... 257/194, E29.246, E21.403
See application file for complete search history.

(56) References Cited

U.S. PATENT DOCUMENTS

| | | | |
|---|---|---|---|
| 6,933,544 B2 | 8/2005 | Saito et al. | |
| 7,683,399 B2 | 3/2010 | Ishida et al. | |
| 7,700,973 B2 | 4/2010 | Shen et al. | |
| 7,728,356 B2 * | 6/2010 | Suh et al. | 257/194 |
| 2002/0017696 A1 * | 2/2002 | Nakayama et al. | 257/471 |
| 2002/0167023 A1 * | 11/2002 | Chavarkar et al. | 257/194 |
| 2004/0155260 A1 * | 8/2004 | Kuzmik | 257/192 |
| 2005/0077541 A1 | 4/2005 | Shen et al. | |
| 2005/0121661 A1 * | 6/2005 | Beach | 257/11 |
| 2006/0214193 A1 * | 9/2006 | Hayamura et al. | 257/213 |
| 2008/0006845 A1 * | 1/2008 | Derluyn et al. | 257/192 |
| 2008/0124851 A1 * | 5/2008 | Zhang et al. | 438/172 |
| 2008/0237606 A1 * | 10/2008 | Kikkawa et al. | 257/76 |
| 2008/0296618 A1 * | 12/2008 | Suh et al. | 257/190 |
| 2009/0072272 A1 * | 3/2009 | Suh et al. | 257/194 |
| 2009/0140293 A1 * | 6/2009 | Vertiatchikh et al. | 257/192 |
| 2009/0218599 A1 * | 9/2009 | Mishra et al. | 257/194 |
| 2009/0267078 A1 * | 10/2009 | Mishra et al. | 257/76 |
| 2010/0084688 A1 | 4/2010 | Lu et al. | |
| 2010/0187570 A1 * | 7/2010 | Saxler et al. | 257/192 |
| 2010/0252901 A1 * | 10/2010 | Rappe et al. | 257/421 |
| 2010/0258841 A1 * | 10/2010 | Lidow et al. | 257/192 |

(Continued)

FOREIGN PATENT DOCUMENTS

| | | |
|---|---|---|
| JP | 10335637 A | 12/1998 |
| JP | 2008244419 A | 10/2008 |

(Continued)

*Primary Examiner* — Julio J Maldonado
*Assistant Examiner* — Jaehwan Oh
(74) *Attorney, Agent, or Firm* — Harness, Dickey & Pierce, P.L.C.

(57) ABSTRACT

According to an example embodiment, a high electron mobility transistor (HEMT) includes a substrate, a buffer layer on the substrate, a channel layer on the buffer layer, and a barrier structure on the channel layer. The buffer layer includes a 2-dimensional electron gas (2DEG). A polarization of the barrier structure varies in a region corresponding to a gate electrode. The HEMT further includes and the gate electrode, a source electrode, and a drain electrode on the barrier structure.

14 Claims, 11 Drawing Sheets

(56) References Cited

U.S. PATENT DOCUMENTS

| | | | |
|---|---|---|---|
| 2010/0258848 A1* | 10/2010 | Lidow et al. | 257/288 |
| 2010/0258912 A1* | 10/2010 | Beach et al. | 257/615 |
| 2010/0264461 A1* | 10/2010 | Rajan et al. | 257/194 |
| 2010/0270591 A1* | 10/2010 | Ahn | 257/194 |
| 2010/0289067 A1* | 11/2010 | Mishra et al. | 257/268 |
| 2010/0327322 A1* | 12/2010 | Kub et al. | 257/194 |
| 2011/0031532 A1* | 2/2011 | Kikkawa et al. | 257/194 |
| 2012/0292665 A1* | 11/2012 | Marino et al. | 257/194 |

FOREIGN PATENT DOCUMENTS

| | | |
|---|---|---|
| JP | 2009010142 A | 1/2009 |
| KR | 20070032390 | 3/2007 |
| WO | WO-2007136401 A2 | 11/2007 |

* cited by examiner

E-MODE HIGH ELECTRON MOBILITY TRANSISTOR AND METHOD OF MANUFACTURING THE SAME

CROSS-REFERENCE TO RELATED APPLICATIONS

This application claims priority under 35 U.S.C. §119 to Korean Patent Application No. 10-2010-0098995, filed on Oct. 11, 2010, in the Korean Intellectual Property Office (KIPO), the entire contents of which are incorporated herein by reference.

BACKGROUND

1. Field

Example embodiments relate to E-mode high electron mobility transistors (HEMTs), methods of manufacturing the same, and/or power devices including the same.

2. Description of the Related Art

High electron mobility transistors (HEMTs) include semiconductors having different energy band gaps. In HEMTs, semiconductors having different energy band gaps are bonded to one another. Also, a semiconductor having a large energy band gap functions as a donor. Due to the semiconductor having a large energy band gap, a 2-dimensional electron gas (2DEG) is generated in a semiconductor having a small energy band gap. In HEMTs, the 2DEG may be used to form a channel.

HEMTs may be used to improve mobility of an electron carrier and may be used as a high withstand voltage transistor in a power device. HEMTs include a semiconductor having a wide band gap, for example, a compound semiconductor. Thus, a breakdown voltage of HEMTs may be large.

The 2DEG may be generated by N-doping material having a large band gap or by using material having polarization. HEMTs basically include a channel and thus operate in a depletion mode.

SUMMARY

According to an example embodiment, in order to simplify a circuit having HEMT's, an enhancement mode (hereinafter, referred to as an E-mode) may be used. An E-mode may be implemented by removing a 2DEG formed under a gate.

According to an example embodiment, a high electron mobility transistor (HEMT) includes a substrate, a buffer layer on the substrate, a channel layer on the buffer layer, and a barrier structure on the channel layer. The channel layer includes a 2-dimensional electron gas (2DEG). A polarization of the barrier structure varies in a region corresponding to a gate electrode. The HEMT further includes the gate electrode, a source electrode, and a drain electrode on the barrier structure.

According to an example embodiment, the barrier structure includes a first barrier layer on the channel layer; a second barrier layer on the first barrier layer, and a third barrier layer on the second barrier layer. The polarization of the second barrier layer varies along a thickness of the second barrier layer.

According to an example embodiment, portions of the second barrier layer extend in a direction of the source electrode and the drain electrode. The source electrode and the drain electrode are on the extended portions of the second barrier layer.

According to an example embodiment, a content of aluminum (Al) in the third barrier layer is less than a content of Al in the first barrier layer.

According to an example embodiment, a content of aluminum (Al) in the first barrier layer is about 15% to about 100%.

According to an example embodiment, a content of aluminum (Al) in the third barrier layer is about 0% to about 20%.

According to an example embodiment, the barrier structure includes a first barrier layer directly on the channel layer, and a second barrier layer on the first barrier layer. The polarization of the first barrier layer varies along a thickness of the first barrier layer.

According to an example embodiment, portions of the first barrier layer extend in a direction of the source electrode and the drain electrode. The source electrode and the drain electrode are on the extended portions of the first barrier layer.

According to an example embodiment, the buffer layer includes a plurality of AlN layers having different Al compositions or a plurality of AlGaN layers having different Al compositions.

According to an example embodiment, the channel layer includes less than 5% of aluminum or indium.

According to an example embodiment, the buffer layer, the channel layer, and the barrier structure include In.

According to an example embodiment, the barrier structure includes Mg.

According to an example embodiment, the gate electrode is a metal electrode or a nitride electrode.

According to an example embodiment, at least a portion of the barrier structure around the source electrode, the drain electrode, and the gate electrode is covered by a layer including one of carbon (C), silicon (Si), germanium (Ge), carbon nitride (CN), silicon nitride (SiN), germanium nitride (GeN), and a compound thereof.

According to an example embodiment, the barrier structure, in a region corresponding to a region of the channel layer having a depleted 2DEG, has a polarization density gradient that exhibits a p-doping effect.

According to an example embodiment, a method of manufacturing a high electron mobility transistor (HEMT) includes sequentially forming a buffer layer, a channel layer, a barrier structure, and a gate electrode on a substrate, forming a mask defining a gate region on the gate electrode, sequentially etching the gate electrode and the barrier structure around the mask, removing the mask, and forming a source electrode and a drain electrode. At least a portion of the barrier structure exhibits a polarization density gradient, According to an example embodiment, the forming the barrier structure includes forming a first barrier layer on the channel layer, forming a second barrier layer exhibiting the polarization density gradient on the first barrier layer, and forming a third barrier layer on the second barrier layer.

According to an example embodiment, the sequentially etching the gate electrode and the barrier structure includes etching the gate electrode and the barrier structure to expose the first barrier layer.

According to an example embodiment, the sequentially etching the gate electrode and the barrier structure includes etching a portion of the second barrier layer when the second barrier layer is etched and stopping the etching.

According to an example embodiment, a content of aluminum (Al) in the third barrier layer is lower than a content of Al in the first barrier layer.

According to an example embodiment, a content of aluminum (Al) in the first barrier layer is about 15% to about 100%.

According to an example embodiment, wherein the forming the barrier structure includes forming a first barrier layer exhibiting the polarization density gradient directly on the channel layer, and forming a second barrier layer on the first barrier layer.

According to an example embodiment, the sequentially etching the gate electrode and the barrier structure includes etching a portion of the first barrier layer when the first barrier layer is etched and stopping the etching.

According to an example embodiment, the barrier structure includes Mg.

According to an example embodiment, the channel layer includes aluminum (Al) or indium (In), a content of Al and In being less than about 5%.

According to an example embodiment, the method further includes adjusting an aluminum (Al) content of the portion of the barrier structure during the forming of the barrier structure to impart the polarization density gradient to the barrier structure.

According to an example embodiment, a content of aluminum (Al) in the buffer structure is about 0% to about 25%.

According to an example embodiment, a content of aluminum (Al) in the third barrier layer is about 0% to about 20%.

According to an example embodiment, the gate electrode is a metal electrode or a nitride electrode.

According to an example embodiment, the method further includes covering at least a portion of the barrier structure around the source electrode, the drain electrode, and the gate electrode by a layer including one of carbon (C), silicon (Si), germanium (Ge), carbon nitride (CN), silicon nitride (SiN), germanium nitride (GeN), and a compound thereof.

BRIEF DESCRIPTION OF THE DRAWINGS

Example embodiments will be more clearly understood from the following brief description taken in conjunction with the accompanying drawings. FIGS. 1-15 represent non-limiting, example embodiments as described herein.

FIG. 1 is a cross-sectional view of a high electron mobility transistor (HEMT) according to an example embodiment;

FIGS. 2 through 4 are cross-sectional views of a polarization density gradient of a second barrier layer of the HEMT illustrated in FIG. 1;

FIG. 6 is a cross-sectional view illustrating the case where the second barrier layer extends to a source and drain electrode of the HEMT illustrated in FIG. 1;

FIG. 7 is a graph showing the content of Al contained in each layer of the HEMT of FIG. 1;

FIG. 8 is a cross-sectional view of an HEMT according to another example embodiment;

FIG. 9 is a graph showing the content of Al contained in each layer of the HEMT of FIG. 8;

FIGS. 10 through 14 are cross-sectional views illustrating a method of manufacturing an HEMT, according to an embodiment of the present invention; and FIG. 15 is a simulation graph showing that, when etching stops in the second barrier layer, the density of a 2-dimensional electron gas (2DEG) of a channel layer is maintained to be uniform regardless of the etching depth of the second barrier layer.

Figure 1:
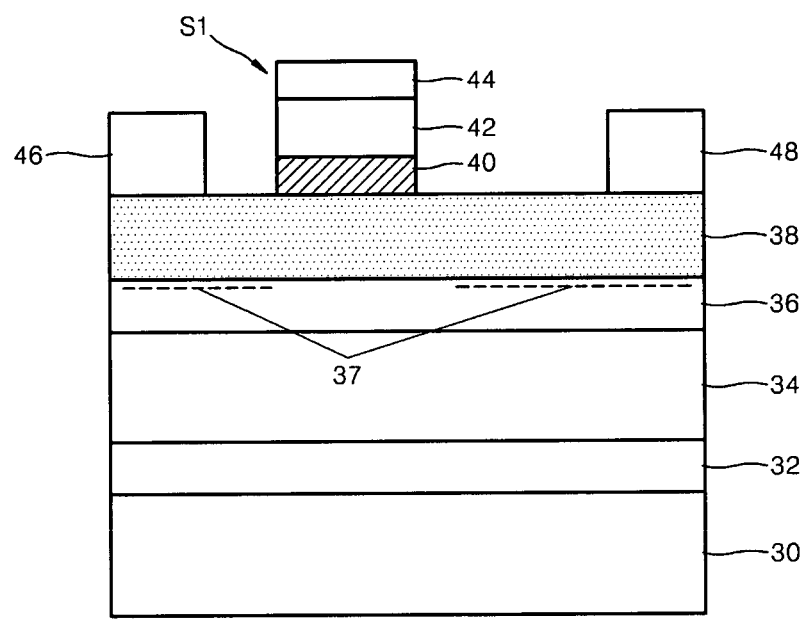

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the teens "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural, forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region fowled by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

First, a high electron mobility transistor (HEMT) having an enhancement mode (E-mode), according to an example embodiment, will be described as follows.

FIG. 1 is a cross-sectional view of a high electron mobility transistor (HEMT) according to an example embodiment. Referring to FIG. 1, a seed layer 32 is formed on a substrate 30. The substrate 30 may be a silicon substrate, a silicon carbide (SiC) substrate, or an aluminum oxide substrate, for example. The aluminum oxide substrate may be an $Al_2O_3$ substrate, for example. The seed layer 32 is used as a layer for growth of a buffer layer 34 to be formed thereon. The seed layer 32 may be an insulating layer or a compound semiconductor layer. For example, the seed layer 32 may be a compound semiconductor layer such as a GaN layer or an AlGaN layer, or a nitride insulating layer such as an AlN layer. The buffer layer 34 is formed on the seed layer 32. The buffer layer 34 may be a compound semiconductor layer such as a GaN layer, an AlGaN layer, or an AlGaInN layer.

The content of Al contained in the buffer layer 34 may be about 0% to about 25%. A channel layer 36 is formed on the buffer layer 34. The channel layer 36 includes a 2-dimensional electron gas (2DEG) 37. The 2DEG 37 is generated under an upper interface of the channel layer 36. The 2DEG 37 is generated in a region excluding a region that corresponds to a gate electrode 44. The 2DEG 37 may be used as a channel carrier. The channel layer 36 may be a compound semiconductor layer, for example, a GaN layer, or another well-known compound semiconductor layer. The thickness of the channel layer 36 may be about 5 nm to about 1000 nm. The channel layer 36 may further include a predetermined or a desired impurity. The impurity may be Al or In, for example. In this regard, the content of the predetermined or the desired impurity may be less than 5%. A first barrier layer (or polarization layer) 38 is formed on the channel layer 36. The first barrier layer 38 may be a lower barrier layer. The first barrier layer 38 has a relatively larger band width in comparison to that of the channel layer 36 and may have a uniform polarization density throughout the first barrier layer 38. The 2DEG 37 is generated due to polarization of the first barrier layer 38. The first barrier layer 38 may be a compound semiconductor layer or an insulating layer. For example, the first barrier layer 38 may be an AlGaN layer, an AlInN layer, or an AlGaInN layer. The content of Al contained in the first barrier layer 38 may be about 15% to about 100%. A thin AlN layer (not shown) may be further formed between the channel layer 36 and the first barrier layer 38. In this regard, the thickness of the AlN layer may be about 1 nm, for example. The thickness of the first barrier layer 38 may be greater than 0 and may be equal to or be less than about 50 nm.

Figure 2:
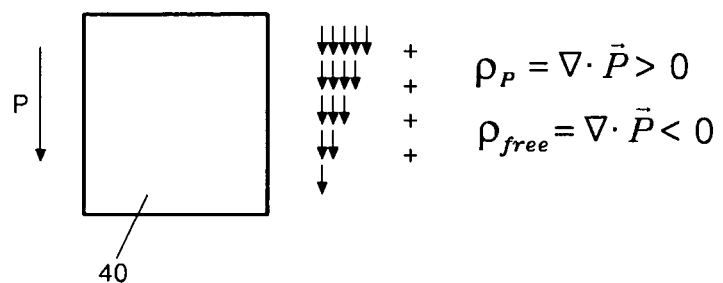
Figure 3:
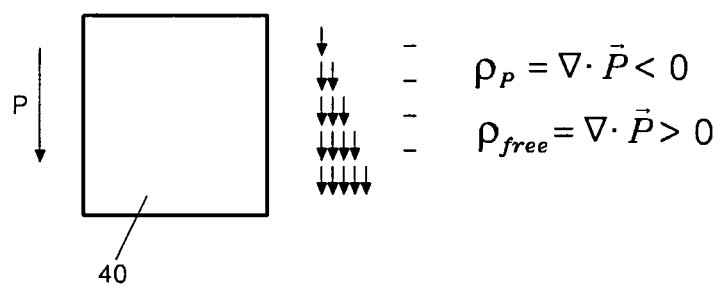
Figure 4:
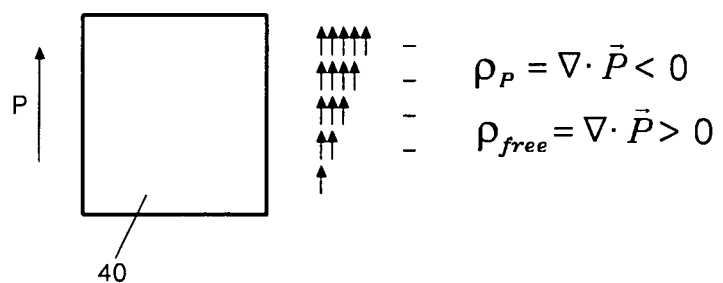

A gate stack S1, a source electrode 46, and a drain electrode 48 are formed on the first barrier layer 38. The gate stack S1, the source electrode 46, and the drain electrode 48 are separated from one another by a predetermined or a desired distance. The gate stack S1 is disposed between the source electrode 46 and the drain electrode 48. A distance by which the gate stack S1 and the source electrode 46 are separated from each other may be less than a distance by which the gate stack S1 and the drain electrode 48 are separated from each other. The gate stack S1 includes a second barrier layer 40 formed on the first barrier layer 38, and a third barrier layer 42 and the gate electrode 44 sequentially stacked on the second barrier layer 40. The second barrier layer 40 may be an intermediate barrier layer. The second barrier layer 40 has a polarization density gradient. For example, the polarization density gradient of the second barrier layer 40 may gradually increase or decrease from one of an upper surface and a lower surface of the second barrier layer 40 to the other surface thereof. FIGS. 2 through 4 illustrate the case where the second barrier layer 40 has a polarization density gradient.

FIG. 2 illustrates the case where the polarization density of the second barrier layer 40 gradually increases from the lower surface to the upper surface of the second barrier layer 40 and the direction of polarization P of the second barrier layer 40 is a downward direction, for example, in a direction of the first barrier layer 38. In FIG. 2, downward arrows on the right side of the second barrier layer 40 represent a change of polarization density in the second barrier layer 40. The change of polarization density in the second barrier layer 40 is shown as five steps for convenience of explanation. The change of polarization density in the second barrier layer 40 may be continuous based on the thickness of the second barrier layer 40. The downward arrows represent a change of polarization density in the second barrier layer 40 based on the thickness of the second barrier layer 40. A higher number of downward arrows may represent a relatively higher polarization density than a lesser number of downward arrows. This representation is also used in FIGS. 3 and 4. As the polarization density of the second barrier layer 40 gradually decreases from the upper surface to the lower surface of the second barrier layer 40, positive polarization charges (+) are created in the second barrier layer 40. In order to compensate for the positive polarization charges (+), negative charges, for example, free electrons are created in the second barrier layer 40. Thus, the second barrier layer 40 shows an n-doping effect. In the equations shown in FIG. 2, $\rho_p$ is a polarization charge density in the second barrier layer 40, and $\rho_{free}$ is a free electron density generated in the second barrier layer 40.

FIG. 3 illustrates the case where the polarization density of the second barrier layer 40 gradually increases from the upper surface to the lower surface of the second barrier layer 40 and the direction of polarization P of the second barrier layer 40 is a downward direction, for example, in a direction of the first barrier layer 38. In FIG. 3, downward arrows on the right side of the second barrier layer 40 represent a change of polarization density in the second barrier layer 40. As the polarization density of the second barrier layer 40 gradually increases from the upper surface to the lower surface of the second barrier layer 40, negative polarization charges (−) are created in the second barrier layer 40. In order to compensate for the negative polarization charges (−), positive charges are created in the second barrier layer 40. Thus, in FIG. 3, the second barrier layer 40 shows a p-doping effect. In equations shown in FIG. 3, $\rho_p$ is a polarization charge density in the second barrier layer 40, and $\rho_{free}$ is a positive charge density generated in the second barrier layer 40.

FIG. 4 illustrates a polarization density gradient when the upper surface of the second barrier layer 40 is formed to have an N-face. The polarization density of the second barrier layer 40 gradually increases from the lower surface to the upper surface of the second barrier layer 40, and the direction of polarization P of the second barrier layer 40 is an upward direction, for example, in a direction of the third barrier layer 42. In FIG. 4, arrows on the right side of the second barrier layer 40 represent a change of polarization density in the second barrier layer 40 based on the thickness of the second barrier layer 40. As the polarization density of the second barrier layer 40 gradually increases from the lower surface to the upper surface of the second barrier layer 40, negative polarization charges (−) are created in the second barrier layer 40. In order to compensate for the negative polarization charges (−), positive charges are created in the second barrier layer 40. Thus, in FIG. 4, the second barrier layer 40 shows a p-doping effect. In equations shown in FIG. 4, $\rho_p$ is a polarization charge density gradient in the second barrier layer 40, and $\rho_{free}$ is a positive charge density generated in the second barrier layer 40.

Referring back to FIG. 1, because polarization of the second barrier layer 40 gradually changes based on the thickness of the second barrier layer 40 and polarization of the second barrier layer 40 is not uniform and thus space charges are created in the second barrier layer 40. The second barrier layer 40 may include In or Mg. The second barrier layer 40 may be a compound semiconductor layer or an insulating layer. For example, the second barrier layer 40 may be an AlGaN layer, an AlInN layer, an AlGaInN layer, or a combination thereof. The thickness of the second barrier layer 40 may be greater than 0 and may be equal to or less than about 50 nm. The content of Al contained in the second barrier layer 40 may gradually or continuously change between the content of Al contained in the first barrier layer 38 and the content of Al contained in the third barrier layer 42. For example, when the content of Al contained in the first barrier layer 38 is about 50% and the content of Al contained in the third barrier layer 42 is about 10%, the content of Al contained in the second barrier layer 40 may be changed from about 49% into about 11% from the lower surface to the upper surface of the second barrier layer 40.

The third barrier layer 42 may be an upper barrier layer. The third barrier layer 42 may include In or Mg. The third barrier layer 42 may be a compound semiconductor layer or an insulating layer. For example, the third barrier layer 42 may be an AlGaN layer, an AlInN layer, an AlGaInN layer, or a combination thereof. The thickness of the third barrier layer 42 may be greater than 0 and may be equal to or less than about 100 nm. The content of Al in the third barrier layer 42 may be about 0% to about 20%. The content of Al in the third barrier layer 42 may be less than the content of Al in the first barrier layer 38. The gate electrode 44 may be a metal electrode such as a nickel (Ni) electrode, a tungsten (W) electrode, an iridium (Ir) electrode, or a platinum (Pt) electrode, or a nitride electrode such as a TiN electrode, a TaN electrode, or a ZrN electrode. A region of the channel layer 36 that corresponds to a lower portion of the gate electrode 44 may include a region showing the same effect as that of a lightly-doped drain (LDD) region. The density of the 2DEG 37 in the region that shows the same effect as that of the LDD region may be lower than the density of the 2DEG 37 around the gate stack S1. The first barrier layer 38 between the gate stack S1 and the source electrode 46, and between the gate stack S1 and the drain electrode 48 may be covered by a passivation layer (not shown). The passivation layer may be formed of one material selected from the group consisting of carbon (C), silicon (Si), germanium (Ge), carbon nitride (CN), silicon nitride (SiN), germanium nitride (GeN), and a compound thereof, for example.

As the second barrier layer 40 is formed between the gate electrode 44 and the channel layer 36, the 2DEG 37 is depleted in the region of the channel layer 36 that corresponds to the gate electrode 44. This is because, because of the second barrier layer 40, the energy band of the first barrier layer 38 is increased in comparison to that of the case where the second barrier layer 40 is not formed between the gate electrode 44 and the channel layer 36.

Figure 5A:
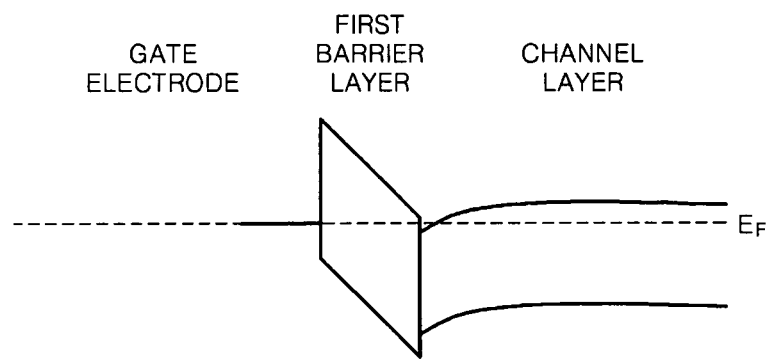
FIG. 5A illustrates energy bands of a first barrier layer and a channel layer when a second barrier layer is not formed in the HEMT of FIG. 1.
Figure 5B:
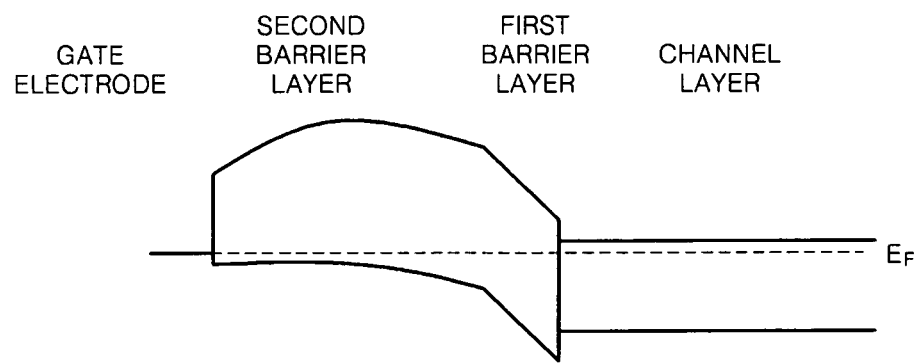
FIG. 5B illustrates energy bands of the first barrier layer, the channel layer, and the second barrier layer when the second barrier layer is formed in the HEMT of FIG. 1.

In detail, FIG. 5A illustrates energy bands of the first barrier layer 38 and the channel layer 36 when the second barrier layer 40 is not formed in the HEMT of FIG. 1. FIG. 5B illustrates energy bands of the first barrier layer 38, the channel layer 36, and the second barrier layer 40 when the second barrier layer 40 is formed between the gate electrode 44 and the channel layer 36. By comparing FIGS. 5A and 5B, when the second barrier layer 40 is formed, the energy bands of the first barrier layer 38 and the channel layer 36 may be higher than a Fermi level $E_F$.

Figure 6:
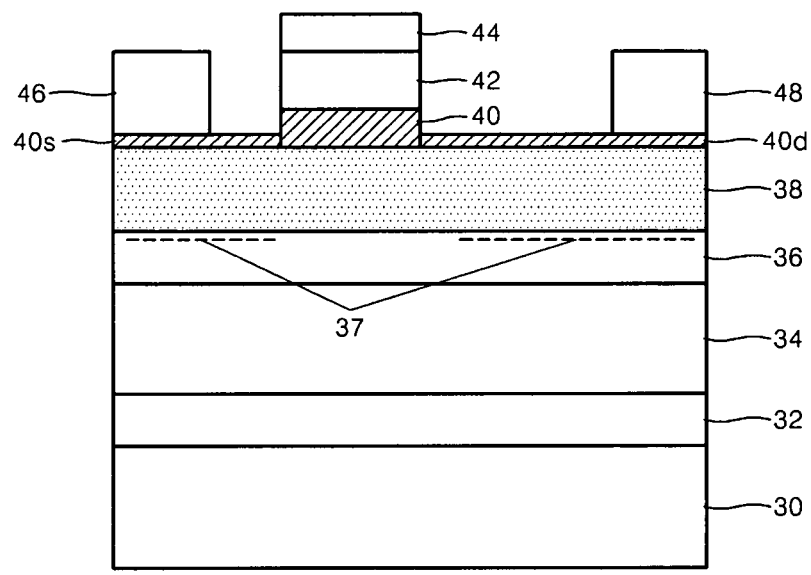

Next, according to another example embodiment, the second barrier layer 40 may extend to the source electrode 46 and the drain electrode 48, as illustrated in FIG. 6. In this regard, the source electrode 46 and the drain electrode 48 may be respectively formed on extended portions 40s and 40d of the second barrier layer 40. Thicknesses of the extended portions 40s and 40d of the second barrier layer 40 may be less than the thickness of the second barrier layer 40.

Figure 7:
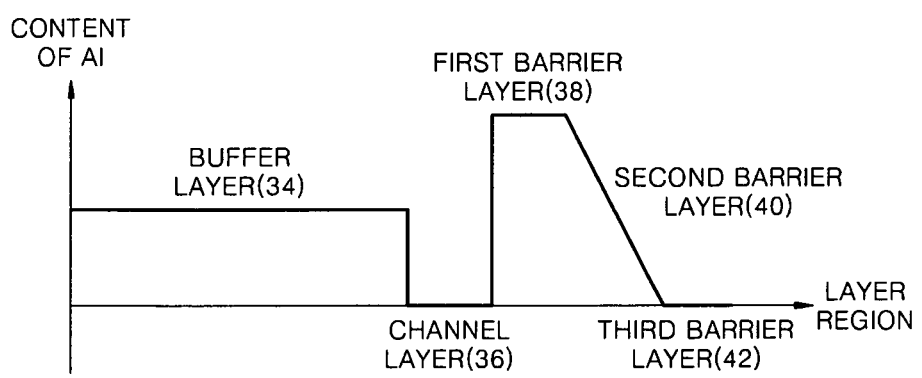

FIG. 7 is a graph showing the content of Al contained in each layer of the HEMT of FIG. 1. Referring to FIG. 7, content of Al contained in the channel layer 36 and the third barrier layer 42 may be 0 or relatively lower than those in other layers. The content of Al contained in the first barrier layer 38 may be highest. In the case of the second barrier layer 40 having a polarization density gradient, the content of Al contained in the second barrier layer 40 may gradually decrease from the first barrier layer 38 to the third barrier layer 43.

Figure 8:
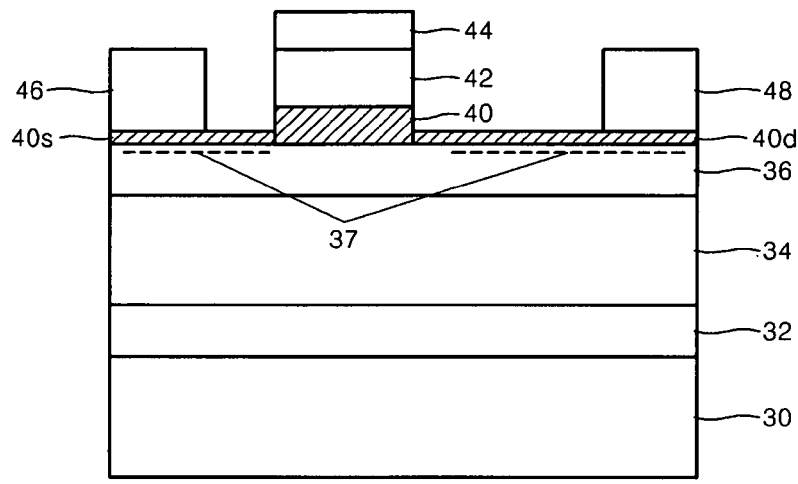

Next, according to another example embodiment, the first barrier layer 38 may be omitted. FIG. 8 illustrates an example thereof.

FIG. 8 is a cross-sectional view of an HEMT according to another example embodiment. Referring to FIG. 8, the second barrier layer 40 and the extended portions 40s and 40d thereof are formed directly on the channel layer 36. In this case, the 2DEG 37 of the channel layer 36 is generated by the extended portions 40s and 40d of the second barrier layer 40. Another configuration including of the first barrier layer 38 may be the same as that of the HEMT illustrated in FIG. 6.

Figure 9:
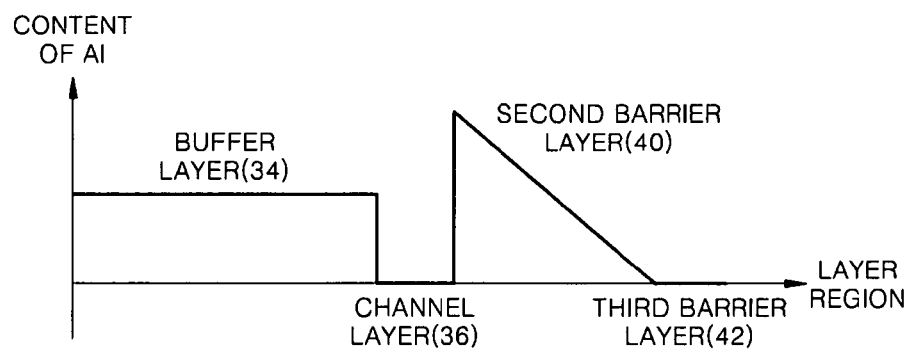

FIG. 9 is a graph showing the content of Al contained in each layer of the HEMT of FIG. 8. Referring to FIG. 9, the content of Al contained in the second barrier layer 40 may gradually decrease from the channel layer 36 to the third barrier layer 42.

Next, a method of manufacturing an HEMT, according to an example embodiment, will be described below with reference to FIGS. 10 through 14. A description of the elements illustrated in FIGS. 1 and 8 is not provided here, and the same reference numerals as those of FIGS. 1 and 8 are used herein.

FIGS. 10 through 14 are cross-sectional views illustrating a method of manufacturing an HEMT, according to an example embodiment.

Figure 10:
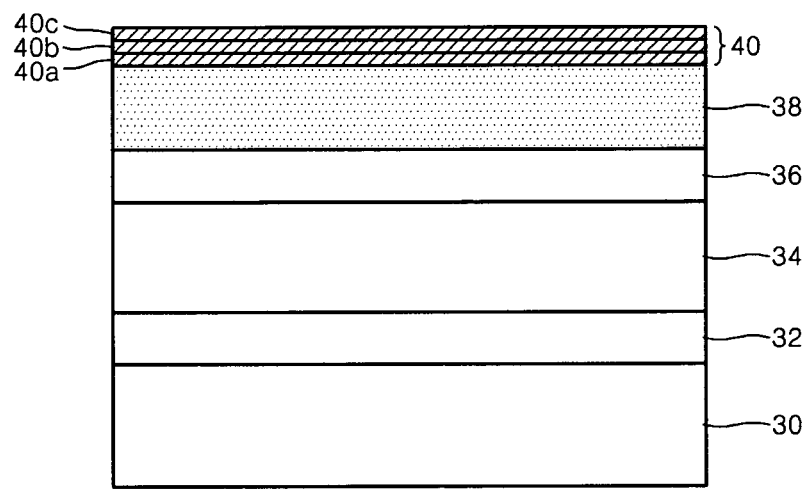

Referring to FIG. 10, a seed layer 32, a buffer layer 34, a channel layer 36, and a first barrier layer 38 are sequentially formed on a substrate 30. The seed layer 32, the buffer layer 34, the channel layer 36, and the first barrier layer 38 may be formed by a stacking method or a growth method. For example, at least the channel layer 36 and the first barrier layer 38 may be formed by an epitaxial growth method. The second barrier layer 40 is formed on the first barrier layer 38. The second barrier layer 40 may also be formed by a stacking method or a growth method. When the second barrier layer 40 is formed, the first barrier layer 38 may be omitted. In other words, the second barrier layer 40 may also be formed directly on the channel layer 36. The second barrier layer 40 may be formed by sequentially forming first, second, and third layers 40a, 40b, and 40c. In the formation procedure, the content of a polarization-inducting component of the second barrier layer 40, for example, Al, may be increased or decreased from the first layer 40a to the third layer 40c. As a result, the second barrier layer 40 has a polarization density gradient from the lower surface to the upper surface of the second barrier layer 40. The content of Al contained in the first layer 40a close to the first barrier layer 38 may be higher than that of Al contained in the third layer 40c, and the opposite may be possible. The content of Al contained in the second layer 40b may be between the content of Al contained in the first layer 40a and the content of Al contained in the third layer 40c. Although the second barrier layer 40 includes the first, second, and third layers 40a, 40b, and 40c, this is for convenience of explanation. The second barrier layer 40 may include three or more layers, and contents of Al contained in the three or more layers may be different from one another. The total thickness of the second barrier layer 40 may be continuously formed, and the content of a polarization-inducting component contained in the second barrier layer 40 may continuously increase or decrease based on the thickness of the second barrier layer 40.

Figure 11:
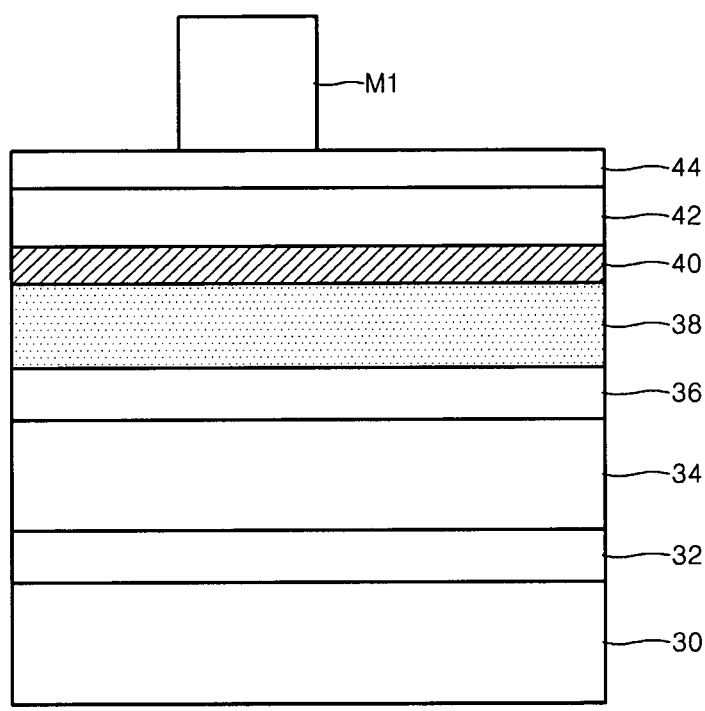
Figure 12:
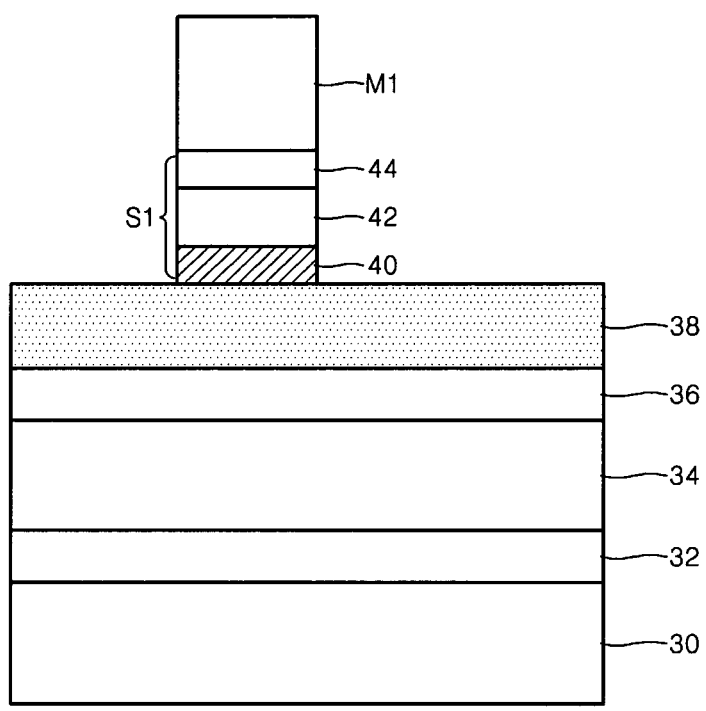

Referring to FIG. 11, the third barrier layer 42 and the gate electrode 44 are sequentially formed on the second barrier layer 40. A mask M1 for defining a gate region is formed on the gate electrode 44. The mask M1 may be a photosensitive pattern, for example. After the mask M1 is formed, the gate electrode 44, the third barrier layer 42, and the second barrier layer 40, which are disposed around the mask M1, are sequentially etched. The etching may be performed until the first barrier layer 38 is exposed, as illustrated in FIG. 12.

Figure 13:
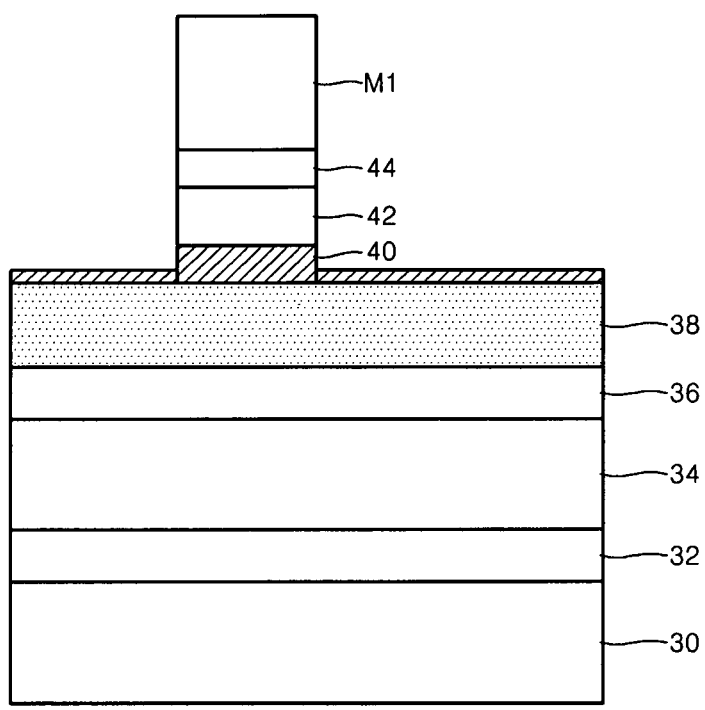

In another example embodiment, only portions of the second barrier layer 40 are removed by the etching, as illustrated in FIG. 13. When only portions of the second barrier layer 40 are removed by the etching, the thickness of the second barrier layer 40 around the mask M1 may be less than the thickness of the second barrier layer 40 under the mask M1. When the etching stops in the second barrier layer 40, as illustrated in FIG. 13, the density of the 2DEG 37 in the channel layer 36 is uniform regardless of the etching depth of the second barrier layer 40. Thus, by setting an etching condition so that the etching stops in the second barrier layer 40, the density of the 2DEG 37 of the channel layer 36 may not be affected by the etching.

As a result of etching, a gate stack S1 is formed on the first barrier layer 38. The gate stack S1 includes the second barrier layer 40, the third barrier layer 42, and the gate electrode 44 sequentially stacked on the first barrier layer 38. After the etching, the mask M1 is removed.

Figure 14:
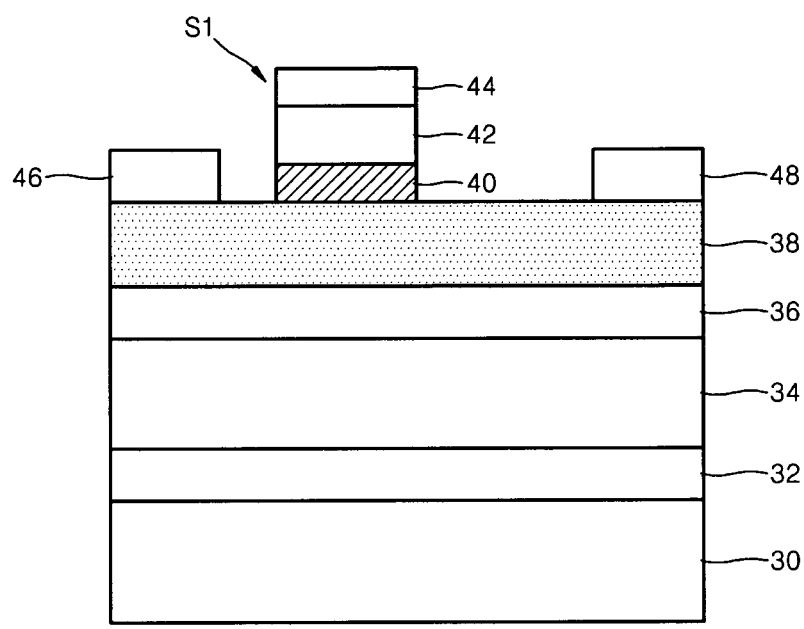

Next, as illustrated in FIG. 14, the source electrode 46 and the drain electrode 48 are formed on the first barrier layer 38. The configuration of the source electrode 46, the drain electrode 48, and the gate stack S1 may be the same as that described with reference to FIG. 1.

When a structure after the etching is formed as in FIG. 13, the source electrode 46 and the drain electrode 48 may be formed on the etched portions of the first barrier layer 38. After the source electrode 46 and the drain electrode 48 are formed, the first barrier layer 38, which is disposed around the source electrode 46, the drain electrode 48, and the gate electrode 44, may be covered by the passivation layer described with reference to FIG. 1.

Figure 15:
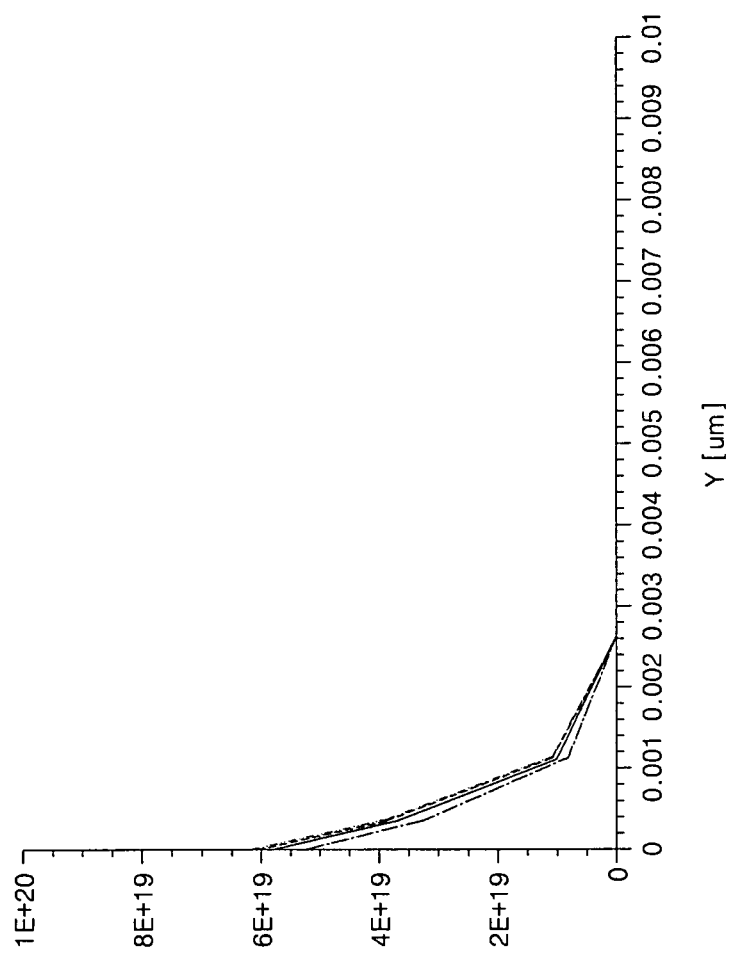

FIG. 15 is a simulation graph showing that, when the etching is stopped in the second barrier layer 40, for example, when the etching is stopped before the first barrier layer 38 is exposed, the density of a 2DEG of the channel layer 36 is maintained to be uniform regardless of the etching depth of the second barrier layer 40.

In the simulation for obtaining the result of FIG. 15, the channel layer 36 and the first barrier layer 38 are formed as a GaN layer having a thickness of about 30 nm and an AlGaN layer having a thickness of 10 nm, respectively, and the second barrier layer 40 is formed as an AlGaN layer. In this regard, the thickness of the second barrier layer 40 differs, for example, about 2 nm, about 4 nm, about 6 nm, or about 8 nm.

In FIG. 15, the horizontal axis represents a depth nm of a channel, and the vertical axis represents a carrier density.

The four graphs of FIG. 15 represent that the thickness of the second barrier layer 40 is about 2 nm, about 4 nm, about 6 nm, and about 8 nm, respectively.

The paths of the four graphs according to the depth of a channel in FIG. 15 are the same in principle, which means that, if the etching is stopped in the second barrier layer 40 regardless of the thickness of the second barrier layer 40, a change of the carrier density does not vary according to the depth of the channel layer 36. In other words, the result of FIG. 15 means that, if the etching is stopped in the second barrier layer 40, the density of the 2DEG 37 at the depth of the channel layer 36 is uniform regardless of the etching.

While example embodiments have been particularly shown and described, it will be understood by one of ordinary skill in the art that variations in form and detail may be made therein without departing from the spirit and scope of the claims.

What is claimed is:

1. A high electron mobility transistor (HEMT), comprising:
   a substrate;
   a buffer layer on the substrate;
   a channel layer on the buffer layer and including a 2-dimensional electron gas (2DEG);
   a barrier structure on the channel layer,
      the barrier structure including an upper part on a lower part, the lower part having a different polarization than the upper part, the lower part of the barrier structure being a first barrier layer on the channel layer, the barrier structure further including a second barrier layer on the first barrier layer, the polarization of the second barrier layer varying along a thickness of the second barrier layer, and the upper part of the barrier structure being a third barrier layer on the second barrier layer;

a gate electrode on the upper part of the barrier structure; and a source electrode and a drain electrode on the lower part of the barrier structure, the source and drain electrodes being spaced apart from the upper part of the barrier structure.

2. The HEMT of claim 1, wherein portions of the second barrier layer extend in a direction of the source electrode and the drain electrode, and the source electrode and the drain electrode are on the extended portions of the second barrier layer.

3. The HEMT of claim 1, wherein a content of aluminum (Al) in the third barrier layer is less than a content of Al in the first barrier layer.

4. The HEMT of claim 1, wherein a content of aluminum (Al) in the first barrier layer is about 15% to about 100%.

5. The HEMT of claim 1, wherein a content of aluminum (Al) in the third barrier layer is about 0% to about 20%.

6. A high electron mobility transistor (HEMT), comprising:

a substrate;

a buffer layer on the substrate;

a channel layer on the buffer layer and including a 2-dimensional electron gas (2DEG);

a barrier structure on the channel layer, the barrier structure including an upper part on a lower part, the lower part having different polarization than the upper part, the lower part of the barrier structure being a first barrier layer directly on the channel layer, the polarization of the first barrier layer varying linearly along a thickness of the first barrier layer, and the upper part of the barrier structure being a second barrier layer on the first barrier layer;

electrode on the upper part of the barrier structure; and a source electrode and a drain electrode on the lower part of the barrier structure, the source and drain electrodes being spaced apart from the upper part of the barrier structure.

7. The HEMT of claim 6, wherein portions of the first barrier layer extend in a direction of the source electrode and the drain electrode, and the source electrode and the drain electrode are on the extended portions of the first barrier layer.

8. The HEMT of claim 1, wherein the buffer layer includes a plurality of AlN layers having different Al compositions or a plurality of AlGaN layers having different Al compositions.

9. The HEMT of claim 1, wherein the channel layer includes less than 5% of aluminum or indium.

10. The HEMT of claim 1, wherein the buffer layer, the channel layer, and the barrier structure include In.

11. The HEMT of claim 1, wherein the barrier structure includes Mg.

12. The HEMT of claim 1, wherein the gate electrode is a metal electrode or a nitride electrode.

13. The HEMT of claim 1, wherein at least a portion of the barrier structure around the source electrode, the drain electrode, and the gate electrode is covered by a layer including one of carbon (C), silicon (Si), germanium (Ge), carbon nitride (CN), silicon nitride (SiN), germanium nitride (GeN), and a compound thereof.

14. A high electron mobility transistor (HEMT), comprising:

a substrate;

a buffer layer on the substrate;

a channel layer on the buffer layer and including a 2-dimensional electron gas (2DEG);

a barrier structure on the channel layer, the barrier structure including an upper part on a lower part, the lower part having a different polarization than the upper part, the barrier structure, in a region corresponding to a region of the channel layer having a depleted 2DEG, and a polarization density gradient that exhibits a p-doping effect;

a gate electrode on the upper part of the barrier structure; and a source electrode and a drain electrode on the lower part of the barrier structure, the source and drain electrodes being spaced apart from the upper part of the barrier structure.

* * * * *